(12) United States Patent
Kanou

(10) Patent No.: US 9,024,457 B2
(45) Date of Patent: May 5, 2015

(54) SEMICONDUCTOR DEVICE AND METHOD FOR MANUFACTURING THE SAME

(75) Inventor: Taikan Kanou, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 154 days.

(21) Appl. No.: 13/557,490

(22) Filed: Jul. 25, 2012

(65) Prior Publication Data

US 2013/0032956 A1 Feb. 7, 2013

(30) Foreign Application Priority Data

Aug. 2, 2011 (JP) ................................. 2011-169597

(51) Int. Cl.
*H01L 23/544* (2006.01)
*G03F 1/42* (2012.01)
*G03F 9/00* (2006.01)

(52) U.S. Cl.
CPC ................ *G03F 1/42* (2013.01); *G03F 9/7084* (2013.01)

(58) Field of Classification Search
CPC .................. H01L 2924/00; H01L 2924/0132; H01L 2924/01029; H01L 23/544; H01L 45/1691; H01L 21/31144; H01L 21/32139
USPC ............. 257/E23.179, 797, E21.54, E21.002, 257/E21.477, E21.53, E31.11, 433, 770; 438/401, 15, 685
See application file for complete search history.

(56) References Cited

U.S. PATENT DOCUMENTS

| | | | |
|---|---|---|---|
| 7,365,002 B2 | 4/2008 | Yamazaki | |
| 2008/0157384 A1* | 7/2008 | Jeon | 257/770 |
| 2008/0289754 A1* | 11/2008 | Sone et al. | 156/272.2 |
| 2009/0127723 A1* | 5/2009 | Zhang et al. | 257/797 |
| 2009/0230493 A1* | 9/2009 | Watanabe et al. | 257/433 |
| 2010/0085554 A1* | 4/2010 | Fan et al. | 355/75 |
| 2011/0290134 A1* | 12/2011 | Itoh et al. | 101/453 |
| 2012/0153323 A1* | 6/2012 | Hawryluk et al. | 257/98 |

FOREIGN PATENT DOCUMENTS

| | | | |
|---|---|---|---|
| JP | 62-117322 A | 5/1987 | |
| JP | 62-271428 A | 11/1987 | |
| JP | 2003-248329 A | 9/2003 | |
| JP | 2004-111866 A | 4/2004 | |

* cited by examiner

*Primary Examiner* — Stephen W Smoot
*Assistant Examiner* — Edward Chin
(74) *Attorney, Agent, or Firm* — Fitzpatrick, Cella, Harper & Scinto

(57) ABSTRACT

A method for manufacturing a semiconductor device includes a first photolithography step of forming a first device pattern corresponding to a first pattern, and a plurality of alignment marks corresponding to a plurality of marks, upon a step of exposing the entire device region in one shot using a first mask including the first pattern and the plurality of marks, and a second photolithography step of, after the first photolithography step, forming second device patterns respectively corresponding to second patterns in a plurality of divided regions which form the device region, upon steps of individually exposing the plurality of divided regions using second masks each including the second pattern corresponding thereto.

6 Claims, 10 Drawing Sheets

F I G. 3
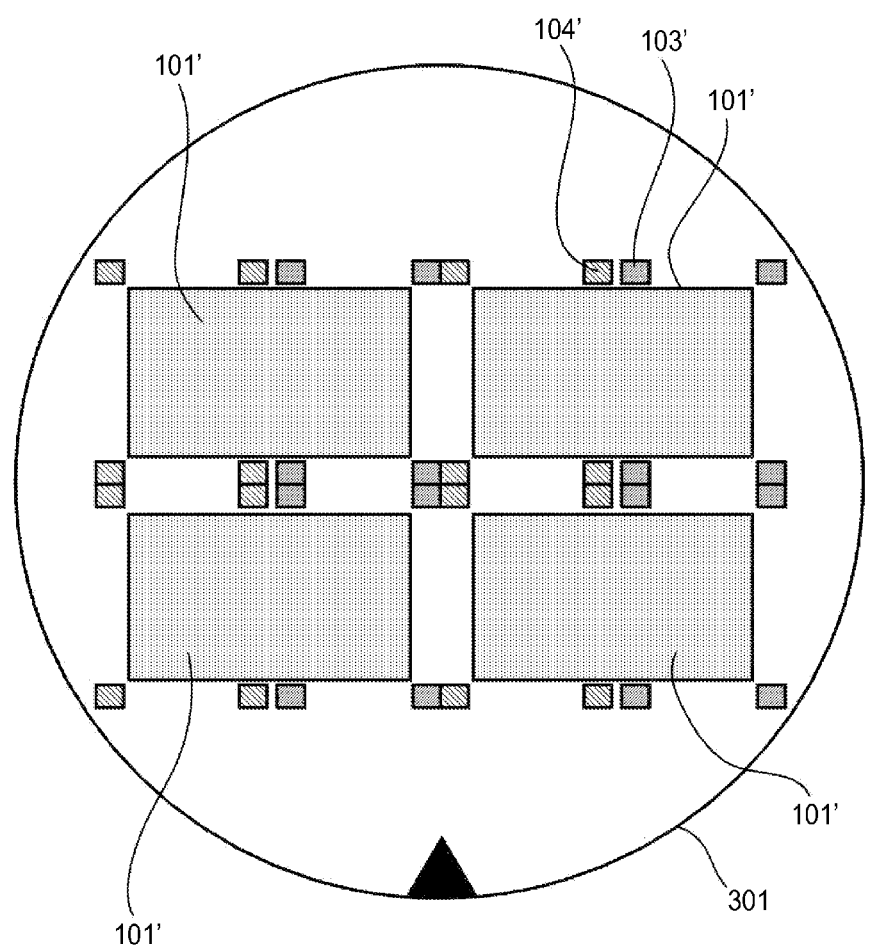

SEMICONDUCTOR DEVICE AND METHOD FOR MANUFACTURING THE SAME

BACKGROUND OF THE INVENTION

1. Field of the Invention

The present invention relates to a semiconductor device and a method for manufacturing the same.

2. Description of the Related Art

Japanese Patent Laid-Open No. 2004-111866 discloses a method for manufacturing a semiconductor device by connecting a plurality of patterns to each other by divided exposure so as to form a single-layered pattern. In this manufacturing method, instead of divided exposure, one-shot exposure is used to form a pattern in a layer including a wiring line which exerts a substantial influence on the operation of the semiconductor device depending on the positional relationship with other wiring lines. Japanese Patent Laid-Open No. 2003-248329 discloses divided exposure performed four times while alignment is performed using alignment marks, which are formed on a glass substrate by one-shot exposure using a photomask for forming them.

Japanese Patent Laid-Open No. 2004-111866 neither discloses nor suggests the arrangement of alignment marks used to align masks for divided exposure with respect to the pattern of a layer formed by one-shot exposure. In this case, when one alignment mark is formed in forming a layer by one-shot exposure, high overlay accuracy can be obtained in divided exposure of a region close to this alignment mark. However, it is difficult to obtain high overlay accuracy in divided exposure of a region far from that alignment mark due, for example, to a magnification error and distortion of a projection optical system of an exposure apparatus, expansion/contraction of a substrate, or a driving error of a stage apparatus which positions the substrate.

In the method described in Japanese Patent Laid-Open No. 2003-248329, a photomask for forming alignment marks includes no circuit pattern, so a photolithography step for forming only alignment marks is indispensable, thus increasing the number of steps.

SUMMARY OF THE INVENTION

The present invention provides a technique advantageous in manufacturing a large-area semiconductor device with high overlay accuracy while requiring only a small number of steps.

One of the aspects of the present invention provides a method for manufacturing a semiconductor device including a device region in which a circuit element is formed, the method comprising: a first photolithography step of forming a first device pattern corresponding to a first pattern, and a plurality of alignment marks corresponding to a plurality of marks, upon a step of exposing the entire device region in one shot using a first mask including the first pattern and the plurality of marks; and a second photolithography step of, after the first photolithography step, forming second device patterns respectively corresponding to second patterns in a plurality of divided regions which form the device region, upon steps of individually exposing the plurality of divided regions using second masks each including the second pattern corresponding thereto, wherein the plurality of marks are arranged on the first mask so that at least one alignment mark is formed in each of the plurality of divided regions, and wherein in the second photolithography step, at least an alignment mark of the plurality of alignment marks, which is formed in a divided region to be exposed is used to align the second mask with the divided region to be exposed, and each divided region has a rectangular shape, and the plurality of marks include marks arranged so that alignment marks are formed at least at three corner portions among four corner portions of the each divided region.

Further features of the present invention will become apparent from the following description of exemplary embodiments with reference to the attached drawings.

BRIEF DESCRIPTION OF THE DRAWINGS

FIG. 3 is a view schematically showing a substrate having undergone the first photolithography step according to the first embodiment of the present invention;

DESCRIPTION OF THE EMBODIMENTS

Figure 1:
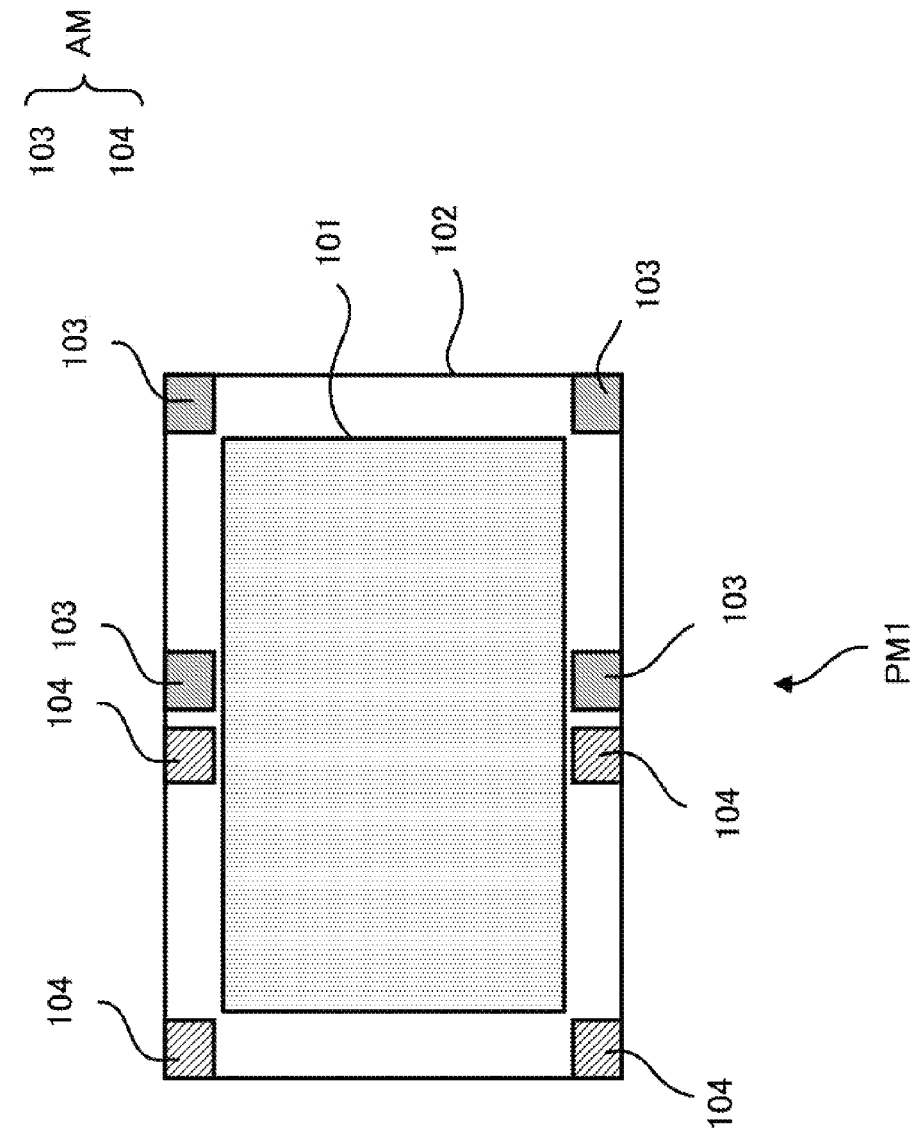
FIG. 1 is a view schematically showing a first mask used in a first photolithography step according to the first embodiment of the present invention.

The first embodiment of the present invention relates to a semiconductor device including a device region in which a circuit element is formed, and a method for manufacturing the same. The manufacturing method according to the first embodiment includes a first photolithography step and a second photolithography step performed after the first photolithography step. The first photolithography step includes a first exposure step of exposing the entire device region on a substrate in one shot, using a first mask including a first pattern and a plurality of first marks. In the first photolithography step, a first device pattern corresponding to the first pattern, and a plurality of alignment marks corresponding to the plurality of first marks are formed in the device region upon the first exposure step. In this case, the substrate includes a first photoresist film formed on a first layer to be patterned, and a latent image of the first pattern and those of the plurality of first marks are formed on the first photoresist film in the first exposure step. These latent images are developed in a development step to form a first photoresist pattern. Using the first photoresist pattern as an etching mask, the underlying first layer is etched, so a first device pattern corresponding to the first pattern, and a plurality of alignment marks corresponding to the plurality of first marks are formed in the device region. The first photoresist pattern can then be removed. Note that the "first layer" is merely a term used to distinguish it from a second layer to be described hereinafter, and therefore is not limited to the initial layer formed on a bare substrate.

The second photolithography step performed after the first photolithography step includes a second exposure step of exposing a plurality of divided regions, which form the device region on the substrate, individually using second masks including second patterns. In the second photolithography step, second device patterns respectively corresponding to the second patterns are formed in the plurality of divided regions upon the second exposure steps. In this case, the substrate to undergo the second photolithography step includes a second layer to be newly patterned on the first layer in which the first device pattern and the plurality of alignment marks are formed, and a second photoresist film applied on the second layer. In the second exposure step, a latent image of the second pattern is formed on the second photoresist film. This latent image is developed in a development step to form a second photoresist pattern. Using the second photoresist pattern as an etching mask, the underlying second layer is etched, so a second device pattern corresponding to the second pattern is formed in the device region. Each of the second masks can include a plurality of second marks, in addition to the second pattern. In this case, in the second exposure step, a latent image of the second pattern and those of the plurality of second marks are formed in the second photoresist film. Second device patterns and a plurality of second alignment marks corresponding to the plurality of second marks are formed upon a development step and an etching step. In this specification, the device pattern means a pattern formed upon a photolithography step, such as a wiring pattern or a contact hole.

The plurality of first marks are arranged in the first mask so that at least one alignment mark is formed in each of the plurality of divided regions. In the second photolithography step, among the plurality of alignment marks formed in the first photolithography step, at least an alignment mark formed in a divided region to be exposed immediately for forming the second pattern is used to align the second mask with the divided region to be exposed immediately. Each alignment mark has an arbitrary shape, and alignment is performed using an arbitrary method. The divided region means herein a region irradiated with light by performing exposure once when one device region is exposed a plurality of times. Exposure in the first photolithography step in which the entire region is exposed in one shot will also sometimes be referred to as one-shot exposure hereinafter, and that in the second photolithography step in which the entire region is divided and exposed will also sometimes be referred to as divided exposure hereinafter. The plurality of divided regions may be formed at different positions or partially overlap each other.

Figure 2:
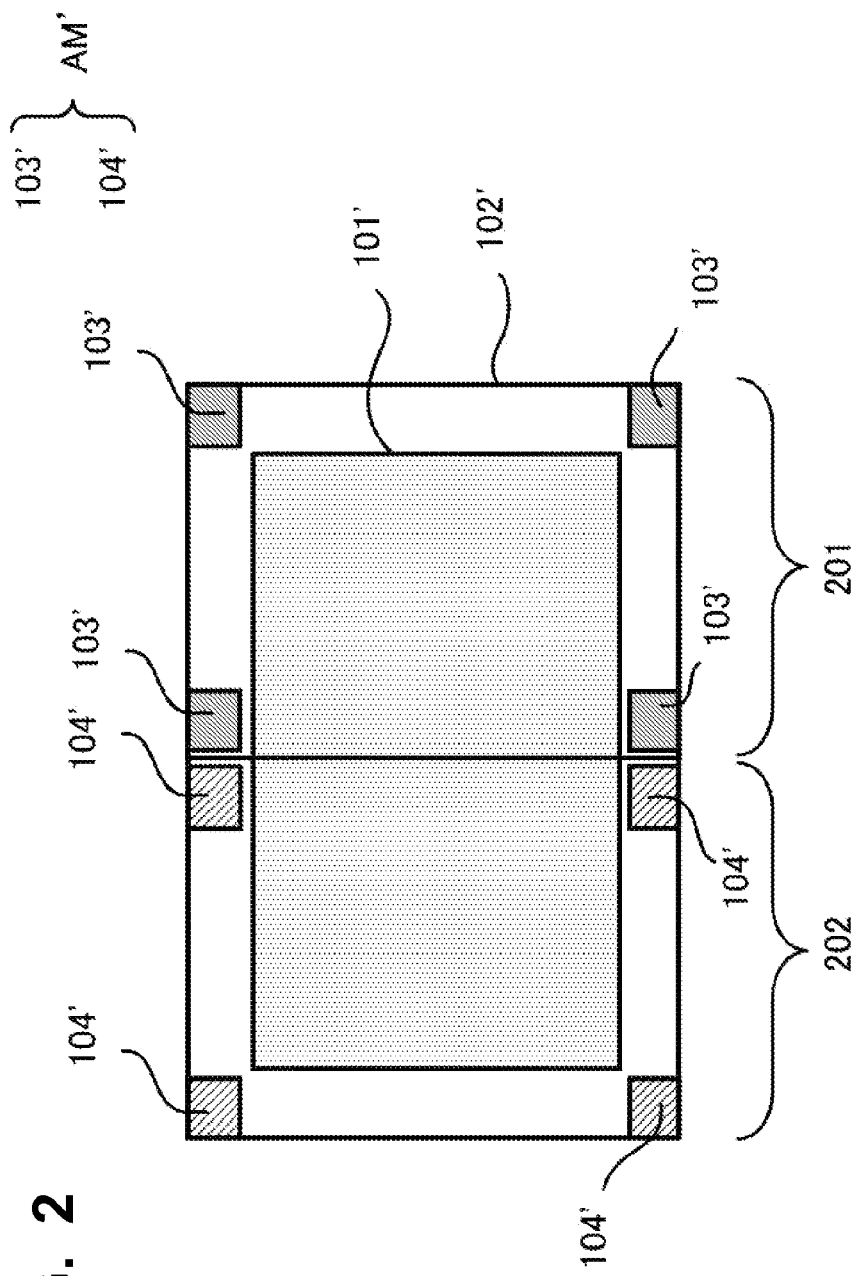
FIG. 2 is a view schematically showing a structure formed in the first photolithography step according to the first embodiment of the present invention.
Figure 4:
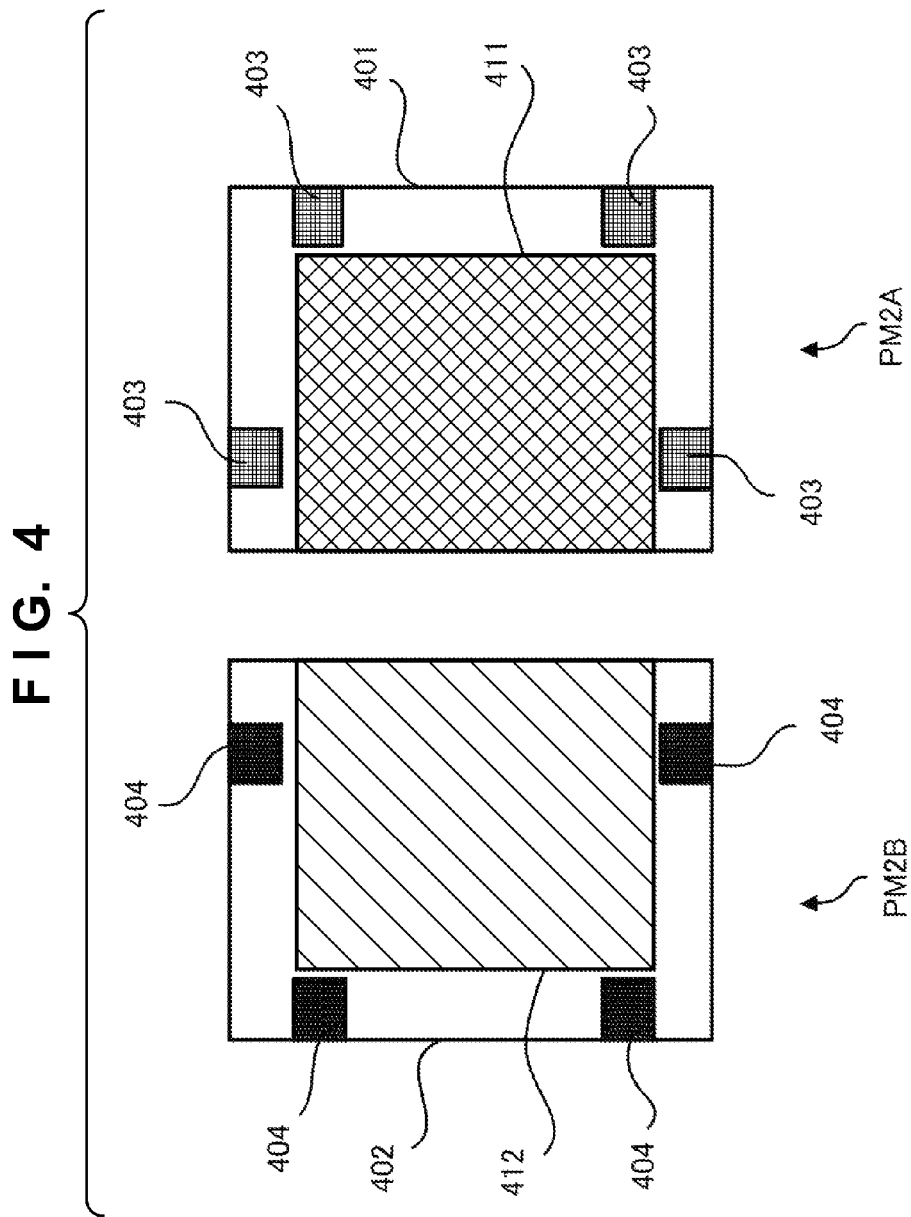
FIG. 4 is a view schematically showing a second mask used in a second photolithography step according to the first embodiment of the present invention.

The first embodiment of the present invention will be described in more detail below with reference to FIGS. 1 to 5 and 9A to 9G. FIG. 1 illustrates a first mask PM1. The first mask PM1 includes a pattern region 102, which includes a first pattern 101 as a pattern for forming a circuit element, and a plurality of first marks AM. FIG. 2 illustrates a structure formed on a substrate in the first photolithography step using the first mask PM1 shown in FIG. 1. A device region 102' corresponding to the pattern region 102 of the first mask PM1 is defined on the substrate. The device region 102' includes a first device pattern 101' corresponding to the first device pattern 101', and a plurality of first alignment marks AM' corresponding to the plurality of first marks AM. The plurality of first alignment marks AM' include alignment marks 103' corresponding to marks 103, and alignment marks 104' corresponding to marks 104.

Note that in the first exposure step of the first photolithography step, the entire device region 102' is exposed in one shot. On the other hand, in the second exposure step of the second photolithography step, a plurality of divided regions 201 and 202 forming the device region 102' are exposed individually. The case wherein one device region 102' includes the first divided region 201 and second divided region 202 as the plurality of divided regions will be exemplified herein for the sake of simplicity. The first marks AM in the first mask PM1 can include the marks 103 for forming alignment marks used in exposing the first divided region 201, and the marks 104 for forming alignment marks used in exposing the second divided region 202. The alignment marks 103' corresponding to the marks 103, and the alignment marks 104' corresponding to the marks 104 are formed in the device region 102' in the first photolithography step.

How to form a pattern for the gate electrodes of transistors in the first photolithography step, and form contact holes to be connected to the pattern in the second photolithography step will be explained below as a more practical example with reference to FIGS. 9A to 9G. FIGS. 9A to 9G are sectional views schematically showing a cross-section of a device to explain a manufacturing method according to this embodiment. FIGS. 9A to 9G show arbitrary portions of the device region 102' (FIG. 2) in a region in which a device pattern is formed and that in which alignment marks are formed.

Figure 9A:
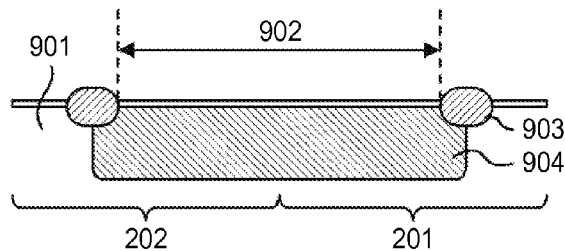
FIGS. 9A to 9G are sectional views schematically showing a cross-section of a device to explain a manufacturing method according to the first embodiment of the present invention.

First, referring to FIG. 9A, an active portion 902 and element isolation portion 903 are formed in a substrate (for example, a silicon substrate) 901, and an impurity region 904 is further formed in the substrate 901. Note that in this example, the limit in an overlay error between the active portion 902 and the subsequently formed device pattern is not strict.

Figure 9B:
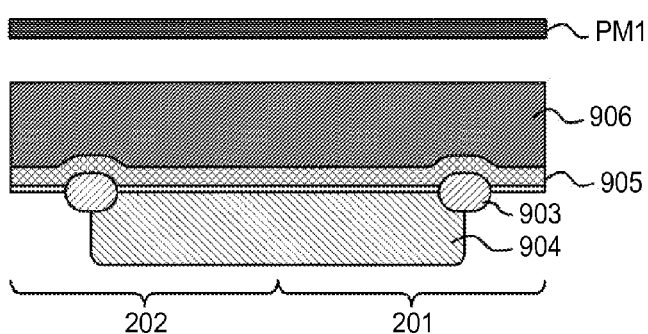
Figure 9C:
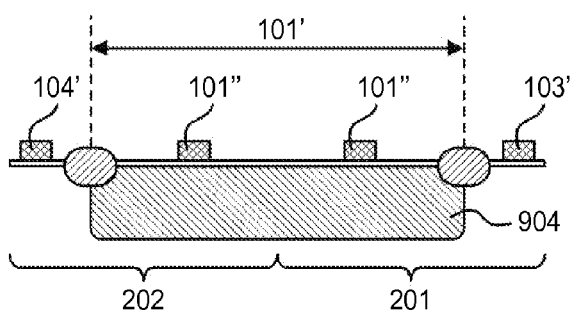

Then, a polysilicon layer (first layer) 905 is formed in the entire region of the substrate 901, and a first photoresist film 906 is formed on it, as shown in FIG. 9B. A first photolithography step is performed to pattern the polysilicon layer (first layer) 905, so a first device pattern 101' is formed (FIG. 9C). Note that referring to, for example, FIGS. 2 and 9C, the first device pattern 101' does not show each individual wiring pattern but schematically shows a set of wiring patterns. Note that FIG. 9C shows individual device patterns 101".

Figure 9D:
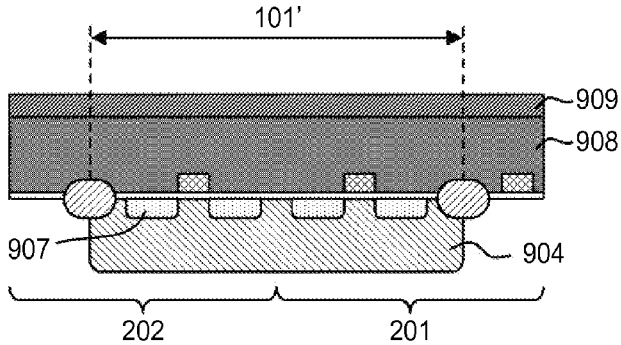

The first photolithography step can include a first exposure step of exposing the first photoresist film 906 using a first mask PM1, and a subsequent first development step and first etching step, as shown in FIG. 9B. In the first development step, the first photoresist film 906 is developed to form a first photoresist pattern (not shown). In the first etching step, the polysilicon layer (first layer) 905 is etched using the first photoresist pattern as an etching mask, so a pattern including gate electrodes is formed as the first device pattern 101'. At this time, first alignment marks AM' including alignment marks 103' and 104' are also formed. If a plurality of device regions 102' are to be formed on the substrate, the first exposure step is repeated a number of times equal to the number of device regions 102'. FIG. 3 schematically illustrates an example in which four device regions 102' are formed on a substrate 301. The first development step in the first photolithography step is performed after a plurality of first exposure steps are completed. A diffusion region 907 including a source region and drain region is formed, an insulating film 908 such as a silicon oxide film is formed on the substrate so as to cover the pattern including the gate electrodes, and a second photoresist film 909 is formed on the insulating film 908 (FIG. 9D).

Figure 9E:
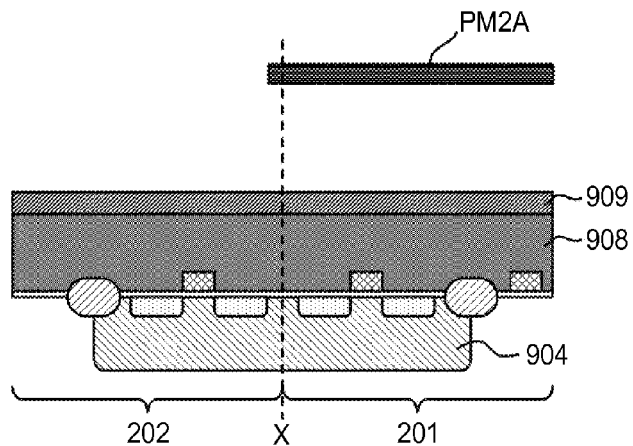
Figure 9F:
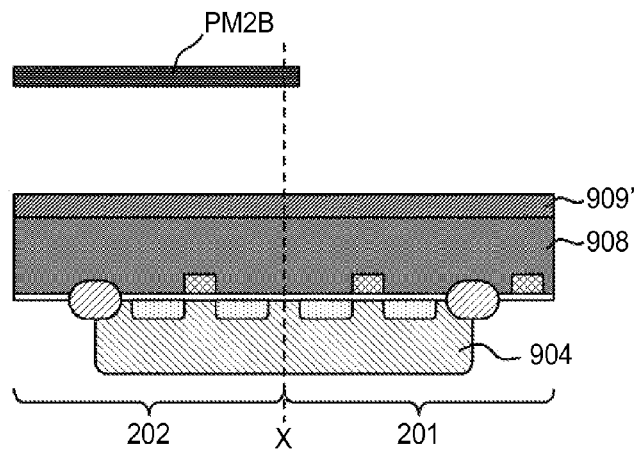
Figure 9G:
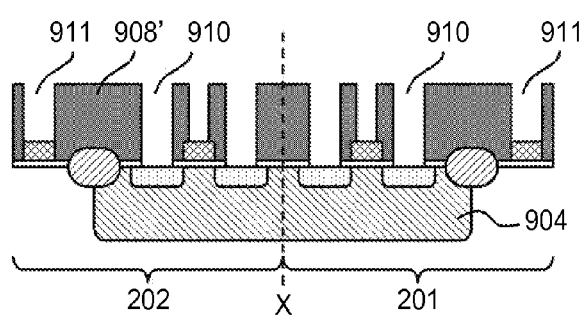

A second photolithography step is then performed, so contact holes to be connected to the pattern including the gate electrodes are formed in the insulating film. The second photolithography step can include second exposure steps of individually exposing two divided regions of the second photoresist film, using two second masks PM2A and PM2B illustrated in FIG. 4, and a subsequent second development step and second etching step. FIG. 9E shows an exposure step of exposing the second photoresist film 909 in a first divided region 201 using the second mask PM2A. FIG. 9F shows an exposure step of exposing the second photoresist film 909 in a second divided region 202 using the second mask PM2B. Note that the optical axis of the exposure apparatus is set at different positions on the substrate during these exposure processes. A photoresist pattern is formed from the second photoresist film 909 upon the second development step, and the second etching step is performed to form a second device pattern including contact holes 910 shown in FIG. 9G. Also, simultaneously with the formation of a second device pattern, holes 911 for forming second alignment marks can be formed. Note that a boundary X is the boundary (to be also referred to as a connecting position hereinafter) between the pattern formed by the second mask PM2A and that formed by the second mask PM2B. Also, the second mask PM2A may extend on the second divided region 202, or the second mask PM2B may extend on the first divided region 201. Although the pattern boundary may be the mask edge, it may be determined in consideration of an overlap between the first divided region 201 and the second divided region 202. Note that the second alignment marks may be formed at positions different from those of the first alignment marks.

Figure 5:
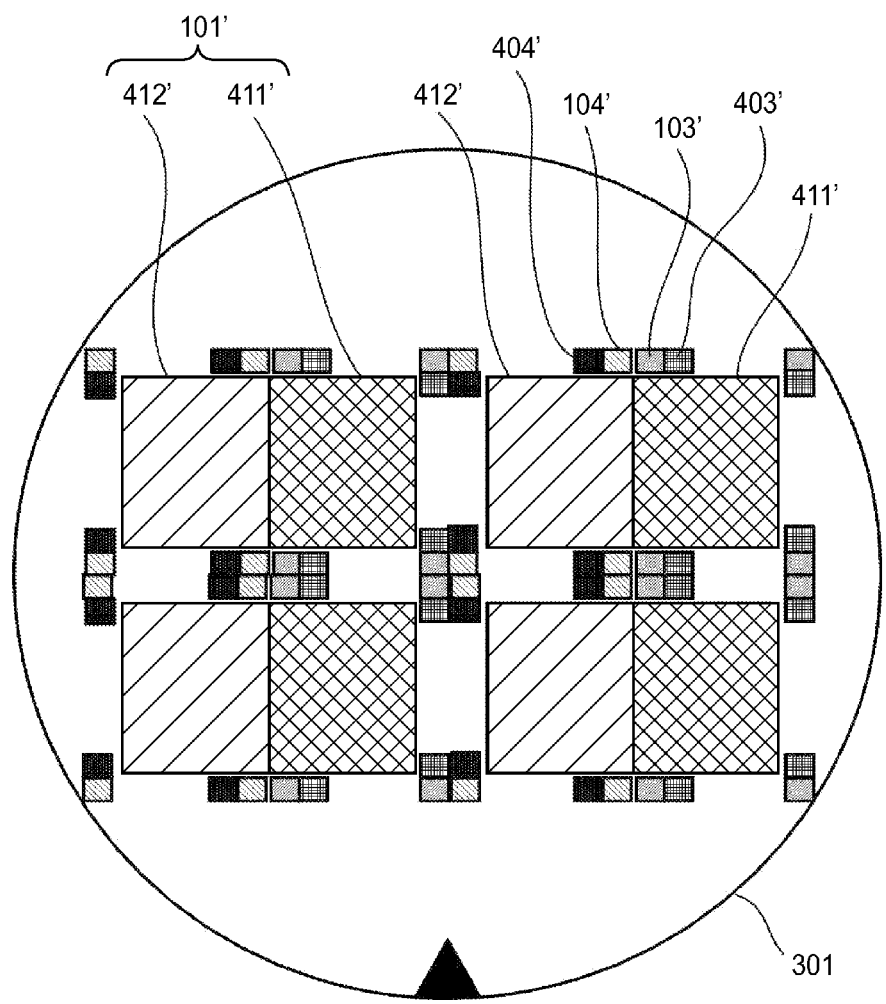
FIG. 5 is a view schematically showing a substrate having undergone the second photolithography step according to the first embodiment of the present invention.

FIG. 5 schematically shows the substrate 301 having undergone the second photolithography step. One second mask PM2A includes a pattern region 401, which includes a second pattern (for example, a pattern for forming the contact holes 910 shown in FIG. 9G) 411 as a pattern for forming a circuit element, and a plurality of second marks (for example, a pattern for forming the holes 911 shown in FIG. 9G) 403. Similarly, the other second mask PM2B includes a pattern region 402, which includes a second pattern (for example, a pattern for forming the contact holes 910 shown in FIG. 9G) 412 as a pattern for forming a circuit element, and a plurality of second marks (for example, a pattern for forming the holes 911 shown in FIG. 9G) 404. Note that the second marks 403 and 404 have arbitrary configurations, and need not be used when the first alignment marks AM' are used in a photolithography step after the second photolithography step.

The second exposure step includes a step of exposing the first divided region 201 in each device region 102' on the substrate 301 using the second mask PM2A, and a step of exposing the second divided region 202 in each device region 102' on the substrate 301 using the second mask PM2B. Note that in exposing the first divided region 201 using the second mask PM2A, the second mask PM2A is aligned with the first divided region 201 using the first alignment marks 103' for the first divided region 201. In exposing the second divided region 202 using the second mask PM2B, the second mask PM2B is aligned with the second divided region 202 using the first alignment marks 104' for the second divided region 202.

In the second development step, the second photoresist film is developed to form a second photoresist pattern. In the second etching step, an insulating layer (second layer) is etched using the second photoresist pattern as an etching mask, so the patterns of contact holes are formed as second device patterns 411' and 412' corresponding to the second patterns 411 and 412, respectively. At this time, second alignment marks 403' and 404' corresponding to the second marks 403 and 404, respectively, are also formed.

The arrangement of a plurality of first marks AM for forming the first alignment marks 103' and 104' used in aligning the second masks PM2A and PM2B and the divided regions 201 and 202 of the first device pattern 101' will be described herein. The plurality of first marks AM (marks 103 and 104) of the first mask PM1 can be arranged on the first mask PM1 so that at least one mark is formed in each of the plurality of divided regions 201 and 202. This makes it possible to more precisely align the divided region 201 (or the divided region 202) and the second mask PM2A (or the second mask PM2B) for exposing it.

Note that when each divided region has a rectangular shape, the plurality of first marks AM (marks 103 and 104) preferably include marks arranged so that alignment marks are formed at least at three corner portions among four corner portions of this divided region. In this case, the manufacturing method can include a step of controlling, during alignment, the magnification and distortion of a projection optical system in an exposure apparatus in accordance with a magnification error (this error can include an error due to expansion/contraction of the substrate) and distortion of the pattern formed in each divided region. This makes it possible to improve the pattern overlay accuracy. Note that even when each divided region does not have a rectangular shape, the overlay accuracy can be improved by forming alignment marks at least at three corner portions of this divided region. The number of adjustment steps can be reduced by decreasing the number of alignment marks used in alignment from four to three.

Also, the plurality of first marks AM preferably include marks arranged so that alignment marks are formed near the boundary X between the divided regions 201 and 202. The plurality of first marks AM can include, for example, marks arranged so that alignment marks are formed in the first divided region 201 near the boundary X, and those arranged so that alignment marks are formed in the second divided region 202 near the boundary X. In this case, it is possible to reduce a shift between the second device patterns 411' and 412' formed using the second masks PM2A and PM2B at the boundary between the divided regions 201 and 202. For example, when the second device patterns 411' and 412' are wiring patterns, it is possible to reduce a shift between them so as to suppress, for example, the occurrence of disconnection or short-circuiting, although details of this arrangement are different from those of the above-mentioned example (the formation of contact holes).

In forming subsequent layers, the first alignment marks AM' may be used, or the second alignment marks 103' and 104' may be used if they are formed.

The semiconductor device can be an image sensing device such as a CMOS sensor, a CCD sensor, or a radiation detection sensor. In a solid-state image sensor, the optical path of incident light varies in each individual pixel upon degradation in position accuracy of wiring patterns, so high position accuracy may be required for the wiring patterns.

Figure 6:
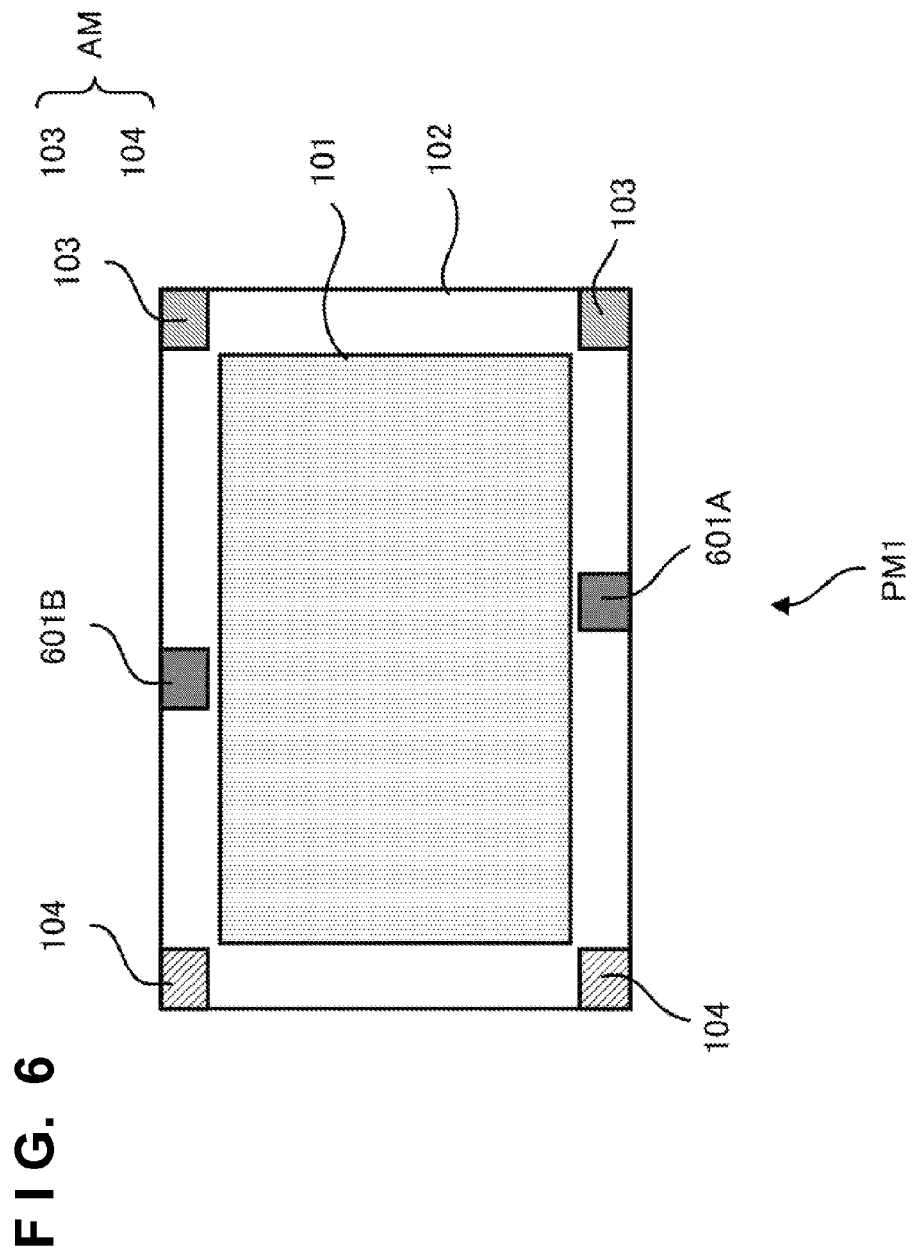
FIG. 6 is a view schematically showing a first mask used in a first photolithography step according to the second embodiment of the present invention.
Figure 7:
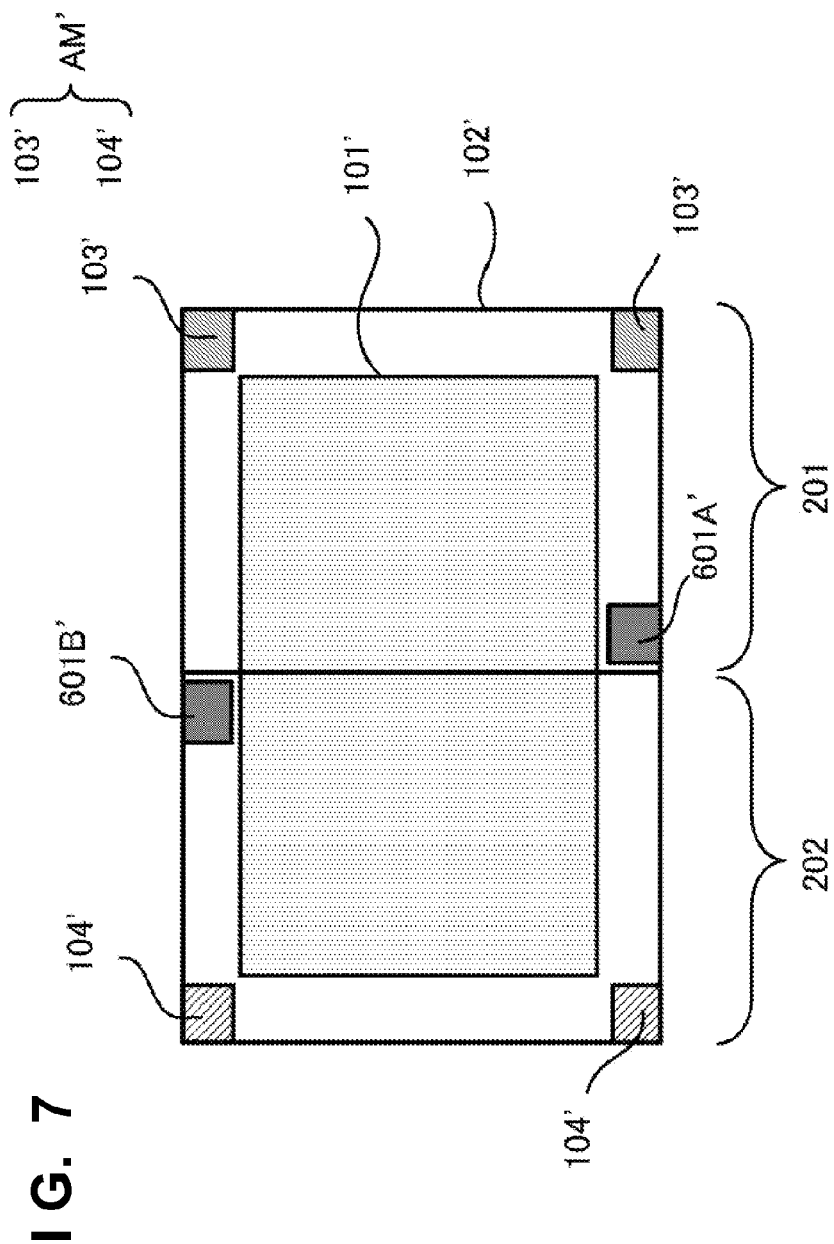
FIG. 7 is a view schematically showing a structure formed in the first photolithography step according to the second embodiment of the present invention.

The second embodiment of the present invention will be described below with reference to FIGS. 6 to 8. Details which are not particularly referred to in the second embodiment can be the same as in the first embodiment. In the second embodiment, a plurality of first marks AM in a first mask PM1 used in the first photolithography step includes marks 103, 104, 601A, and 601B, as illustrated in FIG. 6. The marks 103 are used in exposing only a first divided region 201. The marks 104 are used in exposing only a second divided region 202. Marks 601A and 601B are commonly used in exposing the first divided region 201 and second divided region 202. In this case, the mark 601A is arranged so that an alignment mark 601A' is formed in the first divided region 201, and the mark 601B is arranged so that an alignment mark 601B' is formed in the second divided region 202, as shown in FIG. 7. The commonly-used marks 601A and 601B are preferably arranged so that alignment marks are formed near the boundary between the divided regions 201 and 202. One of the commonly-used marks 601A and 601B need not always be used. FIG. 7 illustrates a structure formed on a substrate in the first photolithography step using the first mask PM1 shown in FIG. 6. A device region 102' corresponding to a pattern region 102 of the first mask PM1 is defined on the substrate. The device region 102' includes a first device pattern 101' corresponding to the first pattern 101, and a plurality of first alignment marks AM' corresponding to the plurality of first marks AM. The plurality of first alignment marks AM' include alignment marks 103' corresponding to the marks 103, alignment marks 104' corresponding to the marks 104, and the alignment marks 601A' and 601B' corresponding to the marks 601A and 601B, respectively.

Figure 8:
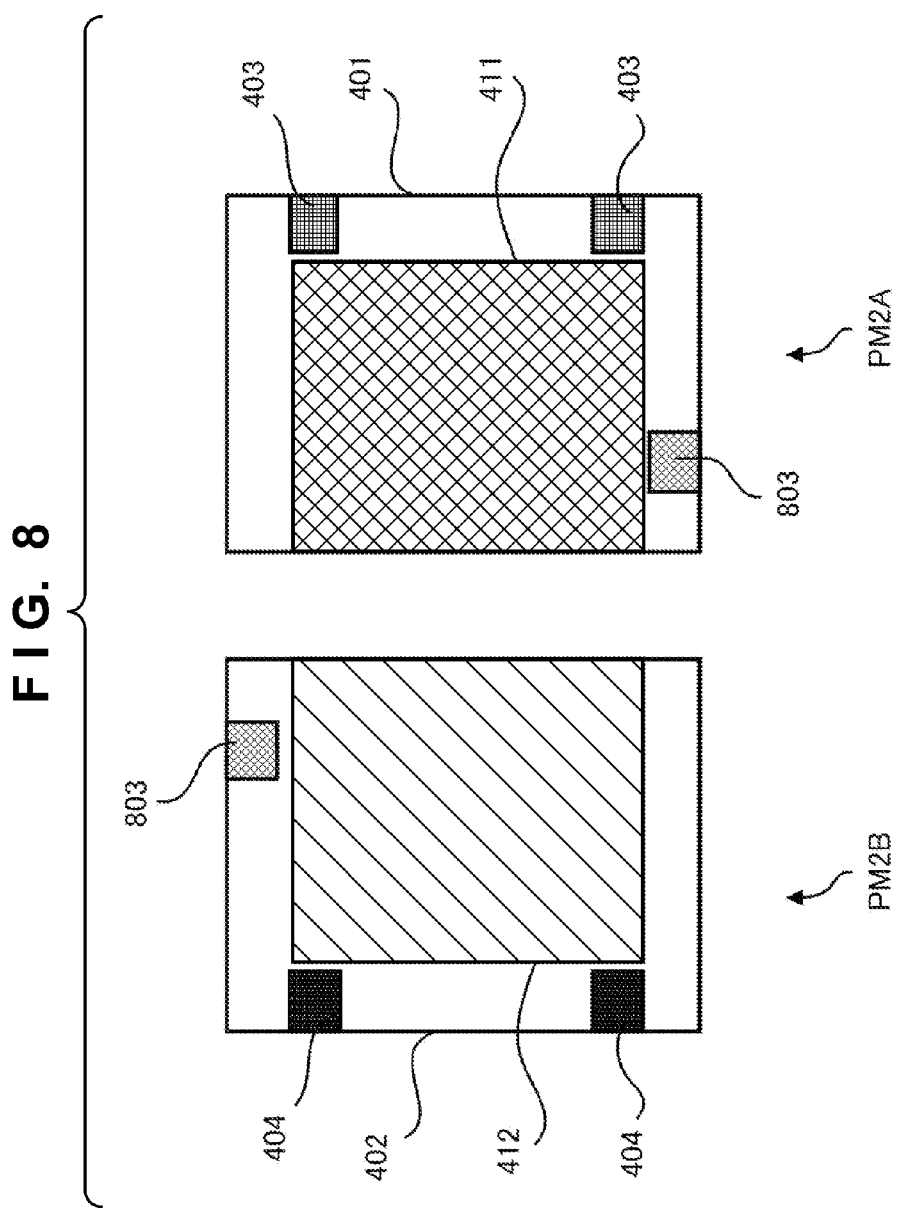
FIG. 8 is a view schematically showing a second mask used in a second photolithography step according to the second embodiment of the present invention.

In the second photolithography step, the two divided regions 201 and 202 are exposed individually using second masks PM2A and PM2B, respectively, illustrated in FIG. 8. One second mask PM2A includes a pattern region 401, which includes a second pattern 411 as a pattern for forming a circuit element, and a plurality of second marks 403 and 803. Similarly, the other second mask PM2B includes a pattern region 402, which includes a second pattern 412 as a pattern for forming a circuit element, and a plurality of second marks 404 and 803. Note that the second marks 403, 404, and 803 have arbitrary configurations, and need not be used when the first alignment marks AM' are used in a photolithography step after the second photolithography step. Also, the second marks 803 serve to form alignment marks which can be commonly used to expose the two divided regions 201 and 202 in the subsequent photolithography step.

As described above, each photolithography step need only include at least an exposure step, and need not always include an etching step. Also, although a pattern including gate electrodes is formed in the first photolithography step in the foregoing description, the present invention is not limited to this. For example, in the first photolithography step, an active portion and element isolation portion may be formed or a pattern including wiring lines may be formed. Moreover, in the first photolithography step, a pattern including color filters or that including microlenses may be formed. Again, although a pattern including contact holes is formed in the second photolithography step, the present invention is not limited to this, and a pattern including gate electrodes, that including wiring lines, or that including color filters, for example, may be formed. A pattern which can be formed in the second photolithography step need only be formed at least after a pattern is formed in the first photolithography step.

A semiconductor device which includes a device region and can be manufactured by the above-mentioned manufacturing method includes a first layer and second layer. The first layer includes a pattern 101' formed upon a step of exposing the entire device region 102' in one shot. The second layer includes patterns 411' and 412' formed upon a step of exposing a plurality of divided regions 201 and 202 forming a device region 102' individually. Note that the first layer includes alignment marks 103' and 104' formed in each of the plurality of divided regions 201 and 202.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-169597, filed Aug. 2, 2011, which is hereby incorporated by reference herein in its entirety.

What is claimed is:

1. A method for manufacturing a semiconductor device including a device region in which a circuit element is formed, the method comprising:
    a first photolithography step of forming a first device pattern corresponding to a first pattern, and a plurality of alignment marks corresponding to a plurality of marks, said first photolithography step including a step of exposing the entire device region in one shot using a first mask including the first pattern and the plurality of marks; and
    a second photolithography step of, after said first photolithography step, forming second device patterns respectively corresponding to second patterns in a plurality of divided regions which form the device region, said second photolithography step including steps of individually exposing the plurality of divided regions at different times using second masks each including the second pattern corresponding thereto,
    wherein the plurality of marks are arranged on the first mask so that at least three alignment marks are formed in each of the plurality of divided regions, and
    wherein, in said second photolithography step, at least one alignment mark of the plurality of alignment marks, which is formed in a divided region to be exposed is used to align the second mask with the divided region to be exposed, and
    each divided region has a rectangular shape, and the plurality of marks include marks arranged so that alignment marks are formed at least at three corner portions among four corner portions of the each divided region.

2. The method according to claim 1, wherein the plurality of marks include a mark arranged so that an alignment mark is formed near a boundary between divided regions in the device region.

3. The method according to claim 1, wherein
    the plurality of divided regions in the device region include a first divided region and a second divided region, and
    the plurality of marks include a mark arranged so that an alignment mark is formed in the first divided region near a boundary between the first divided region and the second divided region, and a mark arranged so that an alignment mark is formed in the second divided region near the boundary.

4. The method according to claim 1, wherein the semiconductor device includes an image sensing device.

5. The method according to claim 1, wherein
    the first device pattern includes a pattern for an element isolation portion, and
    the second device pattern includes a pattern for a contact hole.

6. The method according to claim 1, wherein
    the first device pattern includes a pattern for a gate electrode, and
    the second device pattern includes a pattern for a contact hole.

* * * * *